United States Patent
Iwai et al.

(10) Patent No.: US 11,762,227 B2
(45) Date of Patent: Sep. 19, 2023

(54) DISPLAY DEVICE

(71) Applicant: Japan Display Inc., Tokyo (JP)

(72) Inventors: Youhei Iwai, Tokyo (JP); Michiaki Sakamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 59 days.

(21) Appl. No.: 17/372,668

(22) Filed: Jul. 12, 2021

(65) Prior Publication Data
US 2021/0341810 A1    Nov. 4, 2021

Related U.S. Application Data

(63) Continuation of application No. PCT/JP2020/002734, filed on Jan. 27, 2020.

(30) Foreign Application Priority Data

Jan. 30, 2019  (JP) .............................. JP2019-013784

(51) Int. Cl.
| | | |
|---|---|---|
| *G02F 1/1333* | (2006.01) | |
| *G02F 1/13357* | (2006.01) | |
| *G02F 1/1362* | (2006.01) | |
| *H10K 59/131* | (2023.01) | |

(52) U.S. Cl.
CPC .. *G02F 1/133308* (2013.01); *G02F 1/133615* (2013.01); *G02F 1/136286* (2013.01); *H10K 59/131* (2023.02)

(58) Field of Classification Search
CPC ...................... G02F 1/133308; G02F 1/133615
See application file for complete search history.

(56) References Cited

U.S. PATENT DOCUMENTS

2012/0049718 A1*  3/2012  Watanabe ......... G02F 1/133526
                                          313/110
2013/0271696 A1   10/2013  Dunn

FOREIGN PATENT DOCUMENTS

| JP | 2015-505374 A   | 2/2015  |
| JP | 2018-070818 A   | 5/2018  |
| WO | 2010-122781 A1  | 10/2010 |

OTHER PUBLICATIONS

International Search Report dated Apr. 14, 2020 for the corresponding PCT Application No. PCT/JP2020/002734, with English machine translation.
Japanese Office Action dated Dec. 27, 2022, for the corresponding Japanese Application No. 2019-013784, with English machine translation.

* cited by examiner

*Primary Examiner* — Dung T Nguyen
(74) *Attorney, Agent, or Firm* — Michael Best & Friedrich LLP

(57) ABSTRACT

The purpose is to form images in a middle of a transparent media. Accordingly, the present invention has a structure as follows. A display device including: a plate shaped display medium, having a first major surface and a second major surface, disposed on the pedestal, in which the display medium includes the liquid crystal display panel, disposed in a first transparent medium of refractive index n1, first LEDs, which supply light to the liquid crystal display panel, are disposed in the pedestal, a second transparent medium of refractive index n2 exists between the first LEDs and the liquid crystal display panel, and n2>n1.

8 Claims, 24 Drawing Sheets

FIG. 4
FIG. 5
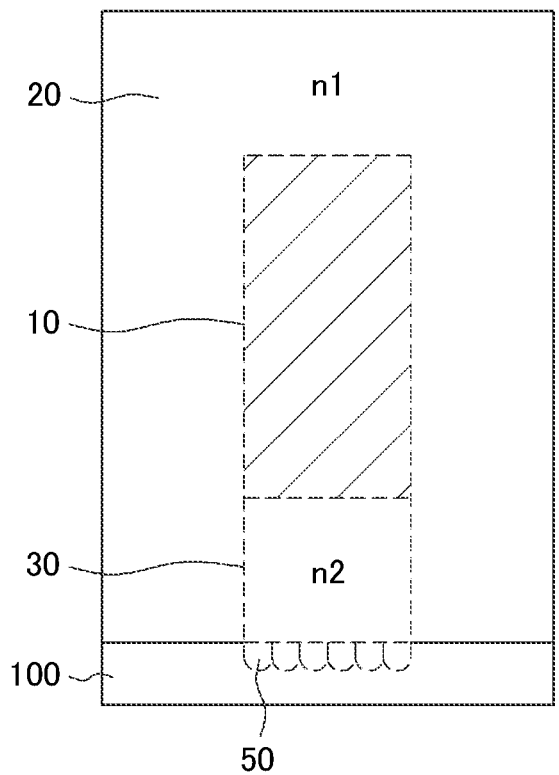
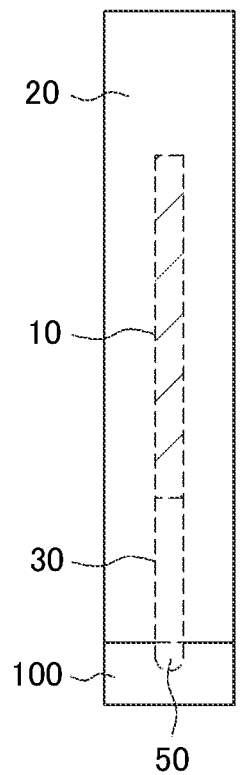

FIG. 6
FIG. 7
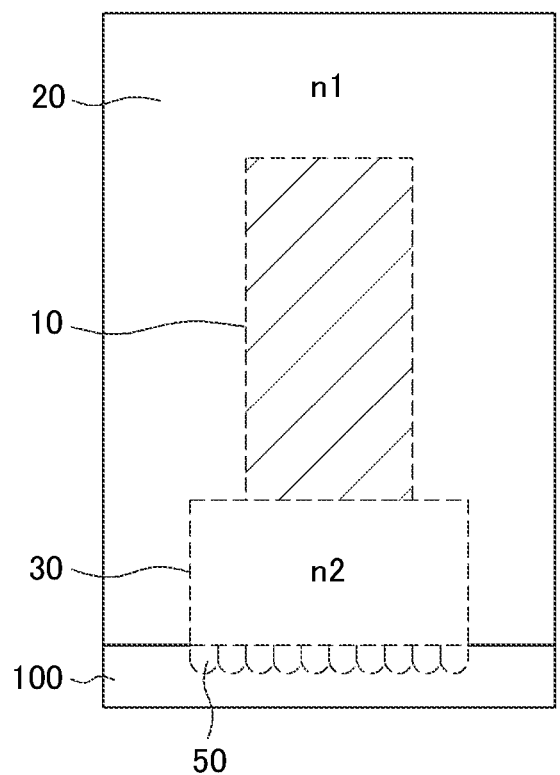
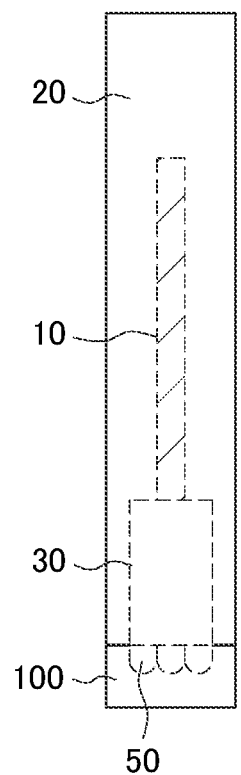

FIG. 8
FIG. 9
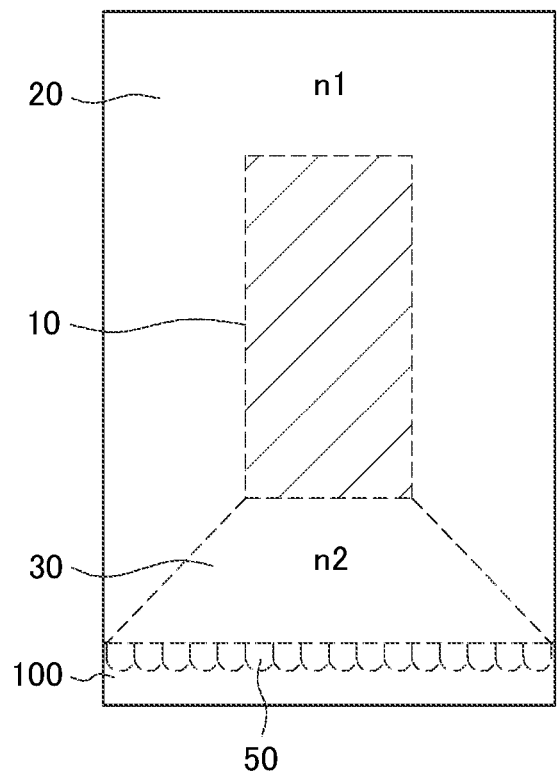
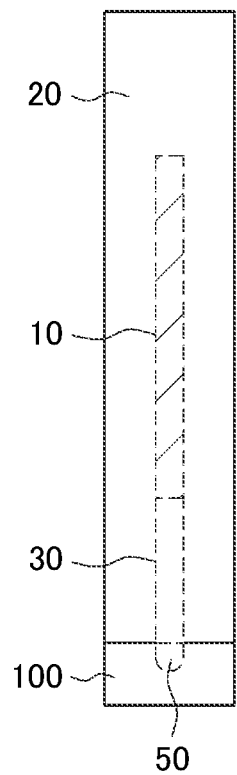

FIG. 12
FIG. 13
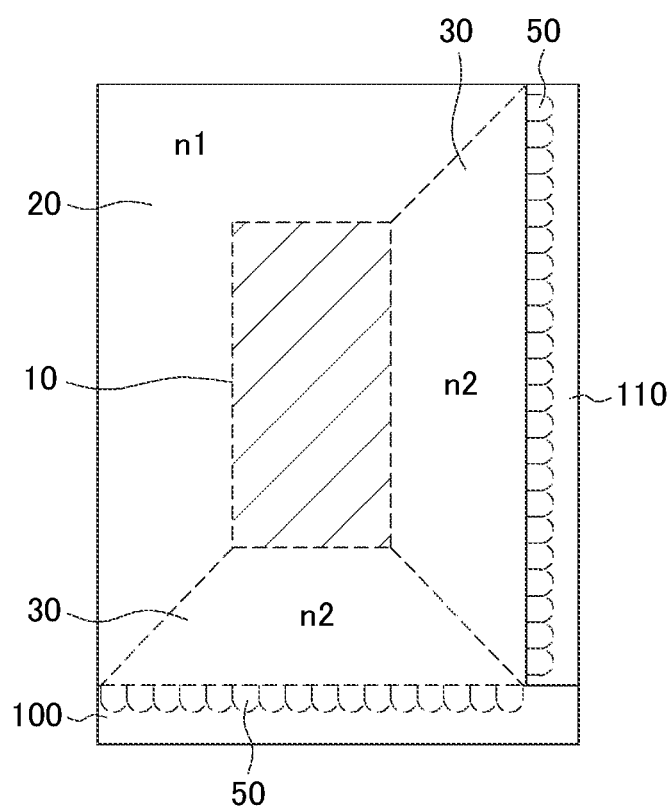
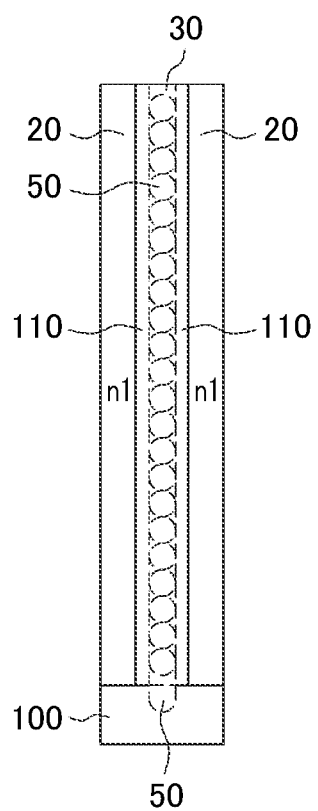

FIG. 21
FIG. 22
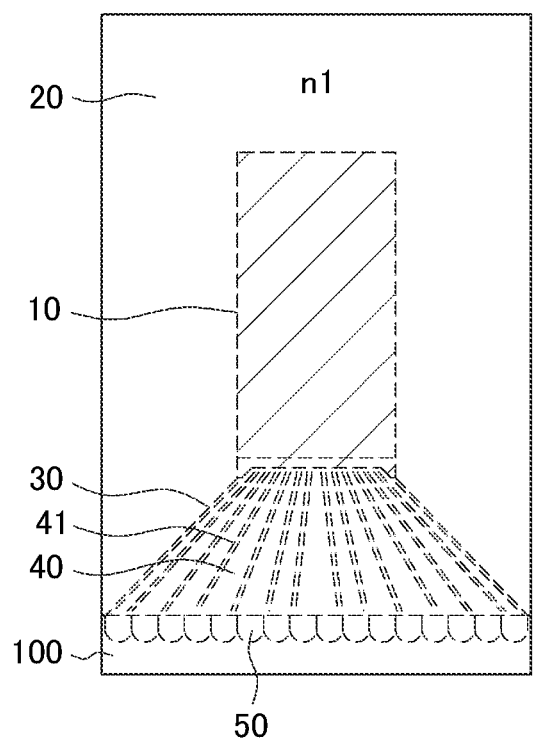
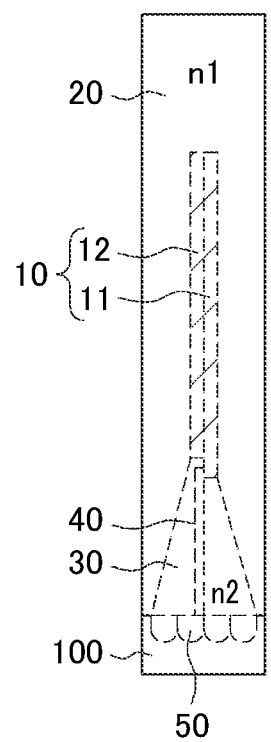

FIG. 23
FIG. 24
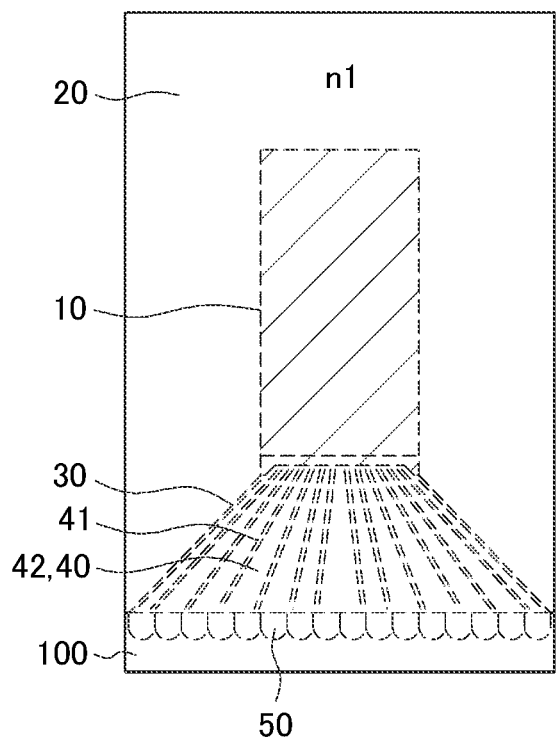
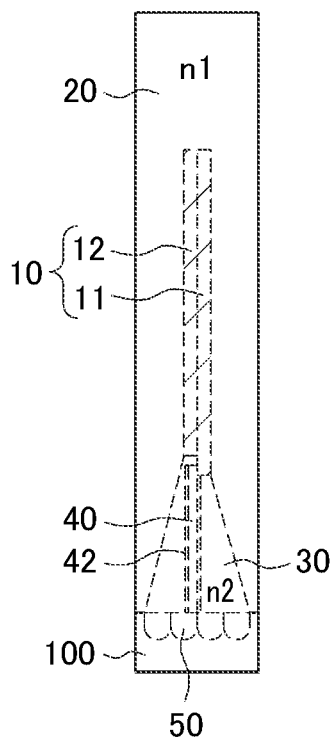

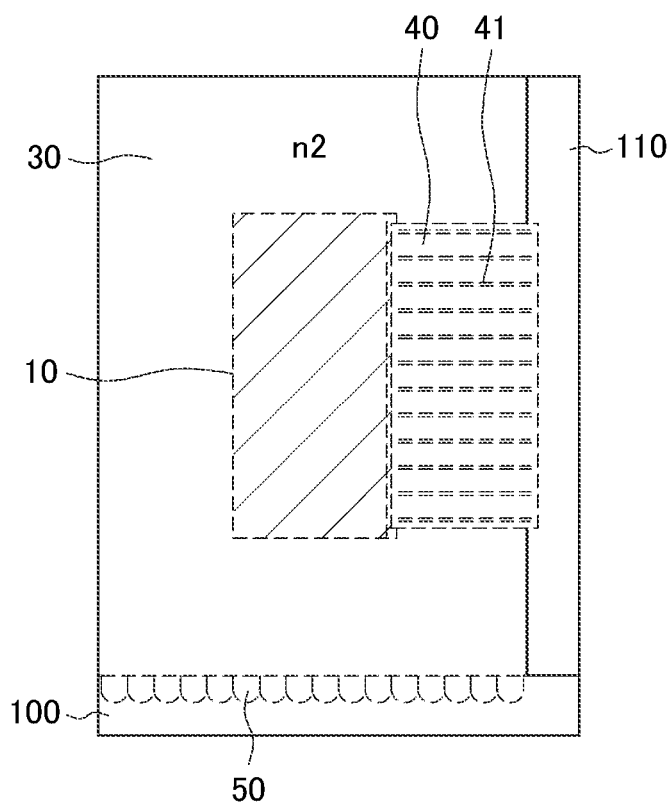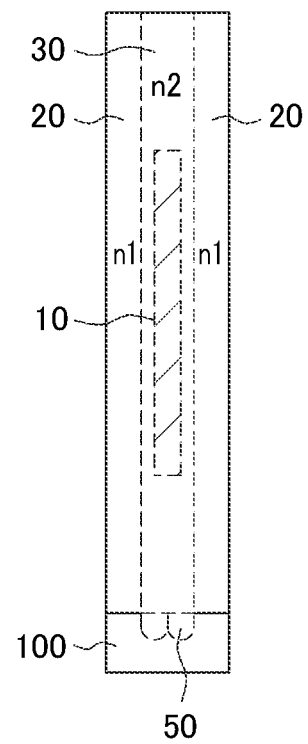

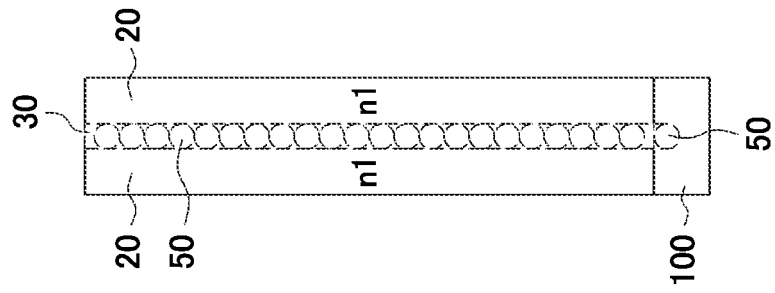
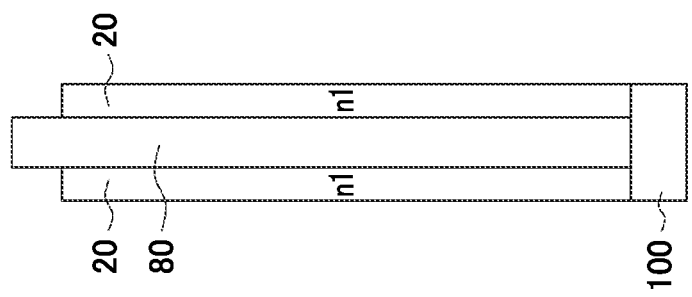
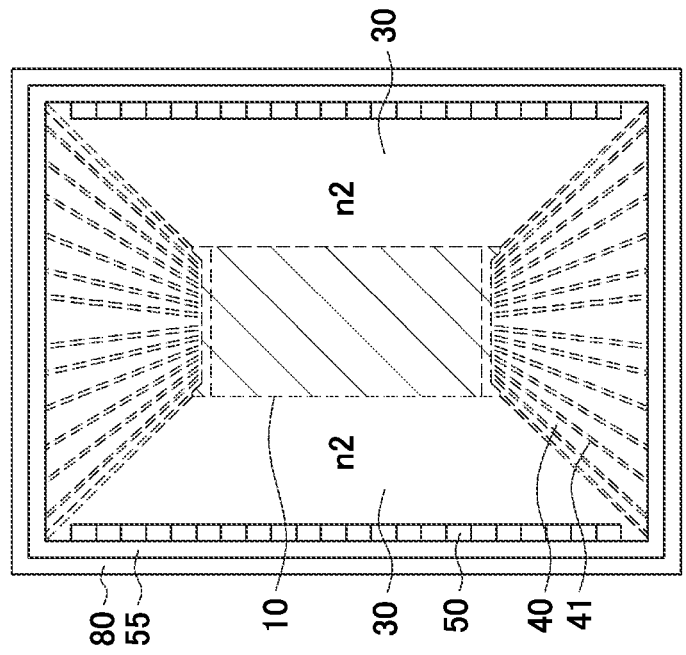

DISPLAY DEVICE

The present application is a continuation application of International Application No. PCT/JP2020/002734, filed on Jan. 27, 2020, which claims priority to Japanese Patent Application No. 2019-013784, filed on Jan. 30, 2019. The contents of these applications are incorporated herein by reference in their entirety.

BACKGROUND OF THE INVENTION

(1) Field of the Invention

The present invention relates to display devices especially to the transparent display devices using liquid crystal or self-luminescent elements like the organic EL or the micro LED and so forth.

(2) Description of the Related Art

There is a demand of the display device that a back side of the display device is visible as the glass. Such a display device can be realized by the liquid crystal display device or a self-luminescent display device using organic EL, inorganic EL, or micro LED elements.

Patent document 1 discloses to set a transparent liquid crystal display device in the back of the front sheet glass of the vending machine to display advertisements on the transparent liquid crystal display device. This transparent liquid crystal display device does not have a specific back light. The LEDs are set in the bezel of the vending machine to irradiate the selling items; the light reflected from the selling items is utilized as a back light for displays by the transparent liquid crystal display device.

Patent document 1: Publication number of Japanese translation of PCT international application No. 2015-505374

SUMMARY OF THE INVENTION

The transparent liquid crystal display device disclosed in patent document 1 has a merit that the back side of the display device is visible in using the basic structure of the conventional liquid crystal display device. However, machines that can adopt the system of patent document 1 are limited.

In the meantime, the transparent liquid crystal display device, in which a back side of the display device is visible as the glass, can be realized as follows. Light enters in the liquid crystal panel from the side surface of the liquid crystal display panel; the light is scattered by the liquid crystal molecules in the liquid crystal display panel; and the light exits from the major surfaces of the liquid crystal display panel.

Namely, images are made by controlling the scattering of the light in each of the pixels with controlling directions of the liquid crystal molecules. The problem of this system is how to guide the light to the side surface of the liquid crystal display panel. The light can enter in the display panel by setting the light source of LEDs at the side surface of the liquid crystal display panel; however, in this system, the light source must be set in the vicinity of the liquid crystal display panel, therefore, a liberty in designing layout of the transparent liquid crystal display panel is limited. The purpose of the present invention is to give liberty in supplying light in the liquid crystal display panel, in other words, to give liberty in disposition of the transparent liquid crystal display panel, thus, to enable the transparent liquid crystal display panel can be utilized in various uses.

The present invention overcomes the above explained problem; the concrete structures are as follows. A display device including: a plate shaped display medium, having a first major surface and a second major surface, disposed on the pedestal, in which the display medium includes the liquid crystal display panel, disposed in a first transparent medium of refractive index n1, first LEDs, which supply light to the liquid crystal display panel, are disposed in the pedestal, a second transparent medium of refractive index n2 exists between the first LEDs and the liquid crystal display panel, and n2>n1.

BRIEF DESCRIPTION OF THE DRAWINGS

FIG. 4 is a front view of a first example of embodiment 1;
FIG. 5 is a side view of FIG. 4;
FIG. 6 is a front view of a second example of embodiment 1;
FIG. 7 is a side view of FIG. 6;
FIG. 8 is a front view of a third example of embodiment 1;
FIG. 9 is a side view of FIG. 8;
FIG. 12 is a front view of a fifth example of embodiment 1;
FIG. 13 is a side view of FIG. 12;
FIG. 21 is a front view of a first example of embodiment 2;
FIG. 22 is a side view of FIG. 21;
FIG. 23 is a front view of a second example of embodiment 2;
FIG. 24 is a side view of FIG. 23;
FIG. 27 is a front view of a fourth example of embodiment 2;
FIG. 28 is a side view of FIG. 27.

FIG. 50 is a plan view of a third example of embodiment 4;

FIG. 51 is a side view of FIG. 50;

FIG. 52 is a side view of FIG. 50, in which the outer frame is eliminated;

DETAILED DESCRIPTION OF THE PREFERRED EMBODIMENTS

The present invention will be described in detail referring to the following embodiments.

In the embodiments, the present invention is explained when it is used with the liquid crystal display panel or the transparent liquid crystal display panel; however, the present invention is not limited to the liquid crystal display panel; that is to say, in the embodiments, the liquid crystal display device can be substituted by the organic EL display device, micro LED display device and so forth; and the liquid crystal display panel can be substituted by the organic EL display panel, micro LED display panel and so forth.

Embodiment 1

Figure 1:
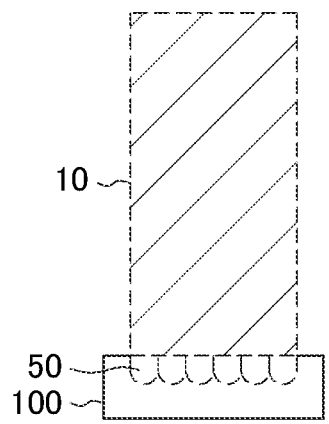
FIG. 1 is a front view of the transparent display device as a comparative example.
Figure 2:
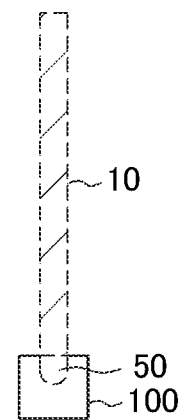
FIG. 2 is side view of FIG. 1.

FIG. 1 is a front view of the liquid crystal display device that does not use a back light. FIG. 2 is a side view of FIG. 1. In FIGS. 1 and 2, the liquid crystal display panel 10 is set on the pedestal 100. The LEDs 50 for the light source, and the external wiring substrate 70 including the driver circuit, which is to be explained later, are installed in the pedestal 100. The LEDs 50 are set along the side of the liquid crystal display panel 10 to supply the light into the liquid crystal display panel 10 from the side surface of the liquid crystal display panel 10.

The transparent liquid crystal display panel 10 is transparent like glass, in which the back side of the display panel 10 can be seen, if the signals are not applied. In the structure of FIG. 1, since the LEDs 50 directly supply the light to the liquid crystal display panel 10, the liquid crystal display panel 10 must be directly set to the pedestal 100. In the pedestal 100, in addition to the LEDs 50, the driving circuit board (e.g. PCB substrate) 70, to drive the transparent liquid crystal display panel 10 and the LEDs 50, is disposed. The driving circuit board 70 can be expressed as the external wiring substrate 70. It is not a good design for the transparent display device in which the LEDs 50 and the external wiring substrate 70 are visible, therefore, both of them are installed in the pedestal 100. The pedestal 100 can be expressed as the container 100. In addition, a film like wiring substrate (e.g. FPC substrate) is necessary to connect the display panel 10 with the external wiring substrate 70; since the film like wiring substrate is preferable not to be visible, a design is improved if the film like wiring substrate is contained in the pedestal 100. However, it is necessary to set the liquid crystal display panel and the pedestal 100 must be set close to each other to satisfy the above requirement; therefore, it cannot meet the design to set the liquid crystal display panel 10 and the pedestal 100 apart, consequently, liberty in designing the liquid crystal display device including the liquid crystal display panel 10 is limited. The self-illuminant display devices as the organic EL display device or the micro LED device do not need LEDs 50 in the pedestal 100; however, they still need the driving circuit substrate including ICs and the film like wiring substrate, thus, they still have the problem that design liberty is limited.

Figure 3:
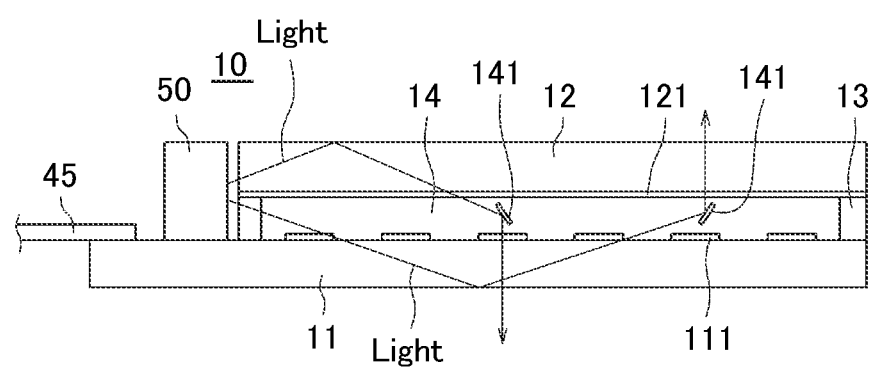
FIG. 3 is a cross sectional view of the transparent liquid crystal display device.

FIG. 3 is a cross sectional view of an example of the transparent liquid crystal display panel 10, which is used in FIGS. 1 and 2, and so forth. In FIG. 3, the first substrate 11 and the second substrate 12 oppose to each other sandwiching the liquid crystal layer 14. The first substrate 11 and the second substrate 12 are adhered to each other by the seal material 13 to hold the liquid crystal inside. The seal material is transparent.

The pixel electrodes 111 are formed from the transparent conductive film on the first substrate 11; the common electrode 121 is formed from the transparent conductive film on the second substrate 12. The powers and signals are supplied to the pixel electrodes 111 and so forth through the film like wiring substrate 45 (herein after, the flexible wiring substrate 45), which is connected to the terminal area of the first substrate 11.

In FIG. 3, the light from the LED 50 enters the second substrate 12 and the liquid crystal layer 14 from the side surface. The liquid crystal is different from the normal liquid crystal; when a signal is applied to the pixel electrode 111, the liquid crystal molecules 141 change their direction to scatter the light from lateral direction to the direction toward the major surface of the transparent liquid crystal display panel 10. The images are formed by controlling the scattering in each of the pixels.

As shown in FIG. 3, the back light does not exist at the back of the transparent liquid crystal display panel 10. Therefore, a back side of the display panel 10 can be visible like glass when the signals are not applied. In FIG. 3, the images are formed on both sides of the transparent liquid crystal display panel 10 according to the signals applied to the pixel electrode 111. By the way, the structure of FIG. 3 is only an example of the transparent liquid crystal display panel. Other structures, in which the light is supplied from the side surface of the liquid crystal display panel and the back light is eliminated, are possible. In the figures hereinafter, the transparent liquid crystal display panel 10 is expressed as a rectangle plate or a combined pair of the rectangle plates to avoid complexity.

FIG. 4 is a front view of the display device in which the transparent liquid crystal display panel 10 according to the present invention is used; FIG. 5 is a side view of FIG. 4. The transparent liquid crystal display panel 10 is disposed, apart from the pedestal 100, in the transparent glass plate or the transparent resin plate. Namely, this is one example of liberal designing in which the designing is not limited by a distance between the transparent liquid crystal display panel 10 and the LEDs 50. Images are formed when signals are applied to the transparent liquid crystal display panel 10; the images look like being floating in the air. The back ground is visible through the transparent liquid crystal display panel 10 when the signals are not applied to the transparent liquid display panel 10 or through a part of the transparent liquid crystal display panel 10 where the signals are not applied to.

In FIG. 4, the LEDs 50 are disposed in the pedestal 100; the light from the LEDs 50 is guided to the side surface of the transparent liquid crystal display panel 10 through the inner casing 30. The transparent liquid crystal display panel 10 and the inner casing 30 are housed in the outer casing 20. Both the outer casing 20 and the inner casing 30 are made from transparent material as glass or transparent resin. Even both the outer casing 20 and the inner casing 30 are transparent, since the refractive index n2 of the inner casing 30 is larger than the refractive index n1 of the outer casing 20, the light from the LEDs 50 repeat reflection at the interface between the inner casing 30 and the outer casing 20, and eventually enters the transparent liquid crystal panel 10 through the side surface of the transparent liquid crystal display panel 10. Even the refractive indices are different between the inner casing 30 and the outer casing 20, both are transparent; thus, the images formed in the transparent liquid crystal display panel 10 look like floating in the air. One example is that the refractive index n1 is 1.5, and the refractive index n2 is 2.0.

In FIG. 4, since the LEDs 50 are not transparent, they are installed in the pedestal 100. The elements, which are not transparent as the driver IC, wring substrate and so forth, are also installed in the pedestal 100. As shown in FIG. 5, the inner casing 30 is housed in the outer casing 20 or sandwiched by the outer casings 20. FIG. 6 is a front view of a second example of embodiment 1; FIG. 7 is a side view of FIG. 6. FIG. 6 differs from FIG. 4 in that numbers of the LEDs 50 contained in the pedestal 100 are increased to increase an amount of the light supplied to the transparent liquid crystal display panel 10, thus to increase a brightness of the screen. The volume of the inner casing 30 is increased according to increase in number of the LEDs 50.

As shown in FIG. 7, the number of LEDs 50 are also increased in the direction of thickness of the display device to increase the amount of light supplied to the transparent liquid crystal display panel 10. Accordingly, a thickness of the inner casing 30 is also increased compared with the case of FIG. 5.

FIG. 8 is a front view of a third example of embodiment 1; FIG. 9 is a side view of FIG. 8. FIG. 8 differs from FIG. 4 in that LEDs 50 are disposed along all the side of the pedestal 100 to increase an amount of the light supplied to the transparent liquid crystal display panel 10, thus a brightness of the screen can be increased. The volume of the inner casing 30 is larger than the inner case of FIG. 4 because of increased number of the LEDs 50; however, in FIG. 8, the sides of the inner casing 30 are tilted in a plan view to guide the light to the transparent liquid crystal display panel more efficiently. FIG. 9 is a side view of FIG. 8; in this example, too, only one LED 50 is disposed in the direction of thickness of the pedestal 100, therefore, the side view of FIG. 8 looks like the same as side view of FIG. 5.

Figure 10:
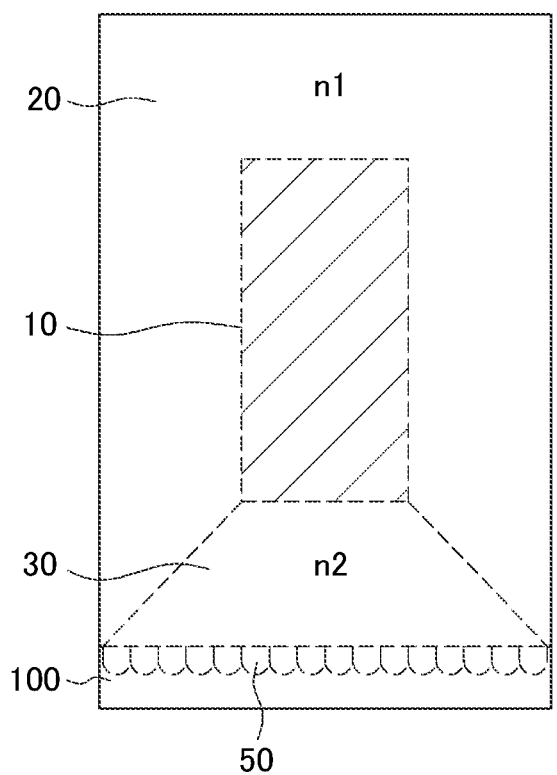
FIG. 10 is a front view of a fourth example of embodiment 1.
Figure 11:
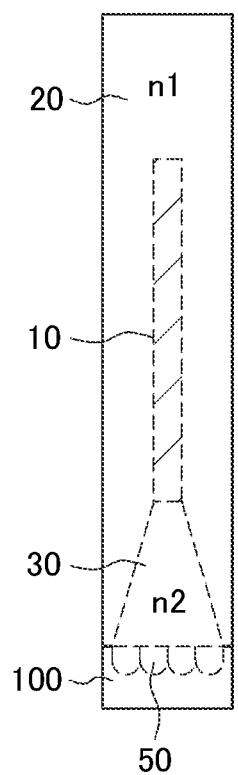
FIG. 11 is a side view of FIG. 10.

FIG. 10 is a front view of a fourth example of embodiment 1; FIG. 11 is a side view of FIG. 10. FIG. 10, which is a front view, looks like a FIG. 8 of third embodiment; however, in the structure of FIG. 10, a plural LEDs 50 are set in a thickness direction of the pedestal 100, thus, more bright images can be displayed. FIG. 11, which is a side view of FIG. 10, depicts this structure. In this example, three LEDs 50 are set in a thickness direction of the pedestal 100. In addition, in FIG. 11, sides of the inner casing 30 are tilted, compared with FIG. 7 or FIG. 9, to guide the light from the LEDs 50 more efficiently to the transparent liquid crystal display panel 10. The volume of the inner casing 30 is increased according to an increase in numbers of LEDs 50.

FIG. 12 is a front view of a fifth example of embodiment 1; FIG. 13 is a side view of FIG. 12. FIG. 12 differs from FIG. 8 in that a pole 110 is formed at one edge of the pedestal 100; LEDs 50 are disposed in the pole 110. The LEDs 50 are disposed all along the side that the pole 110 is formed. Accordingly, the inner casings 30 as light guides are formed in the area from the pedestal 100 to the transparent liquid crystal display panel 10 and in the area from the side corresponding to the pole 110 to the transparent liquid crystal display panel 10. When the transparent liquid crystal display panel becomes larger, enough amount of light cannot be supplied from only one side; therefore, the structure of fifth example enables a large size transparent liquid crystal display panel.

In FIG. 12, the outer casing 20 and the inner casing 30 occupy the same area in a plan view; however, volumes are not the same. As shown in FIG. 13, the area of inner casing 30 in FIG. 12 is also sandwiched by the outer casings 20. However, both the inner casing 30 and the outer casing 20 are transparent; thus, the effect that images are perceived as floating in the air is not changed.

In FIG. 13, the LEDs 50 are disposed in the pole 110. A thickness of the inner casing 30, which guides the light from the LEDs 50, can be chosen between the same thickness of the LEDs 50 and the same thickness of the pole 110. The outer casings 20 sandwich the inner casing 30. The light from the LEDs 50 repeats reflections at the interface between the inner casing 30 and the outer casing 20 and eventually enters the side surface of the transparent liquid crystal display panel 10 from the inner casing 30, whose thickness is thin.

Figure 14:
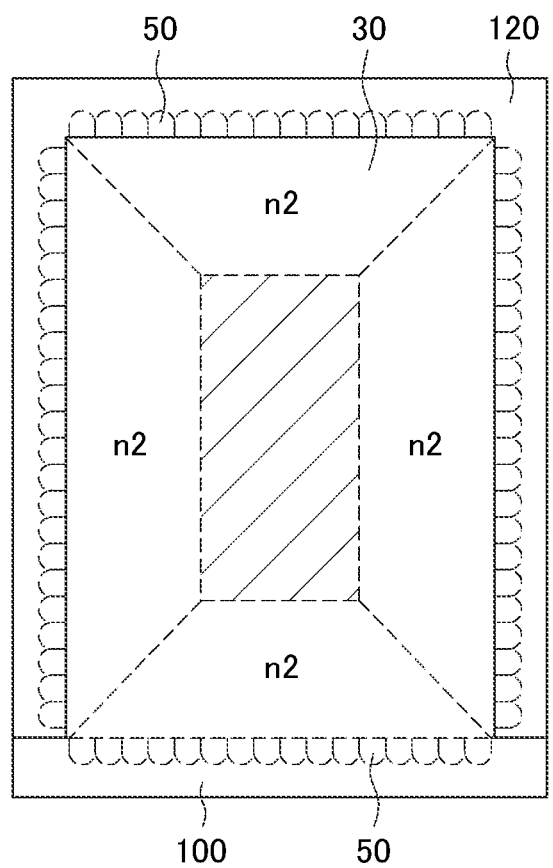
FIG. 14 is a front view of a sixth example of embodiment 1.
Figure 15:
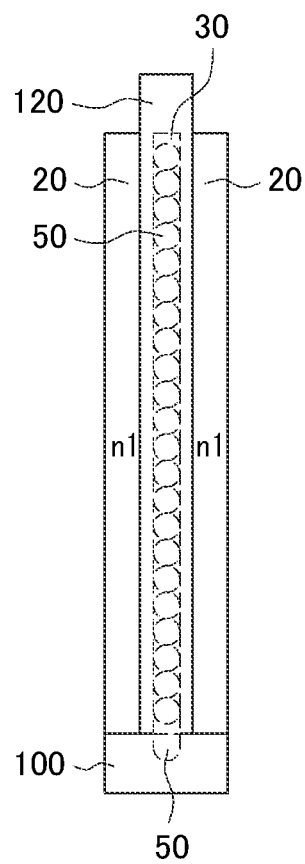
FIG. 15 is a side view of FIG. 14.

FIG. 14 is a front view of a sixth example of embodiment 1; FIG. 15 is a side view of FIG. 14. In FIG. 14, the outer frame 120 is formed around the display device. The LEDs 50 are disposed in the outer frame 120. Light enters in the transparent liquid crystal display panel 10 from the LEDs 50 disposed in the pedestal 100 and in the outer frame 120; thus, the light enters in the liquid crystal display panel 10 from all around. Therefore, bright images are formed.

In FIG. 14, the inner casing 30 as a light guide is formed between the LEDs 50 and the transparent liquid crystal display panel 10. Namely, the inner casing 30 exists all around the transparent liquid crystal display device 10. As shown in FIG. 15, the inner casing 30 is sandwiched by the outer casings 20. Therefore, the light from the LEDs 50 repeats the reflection at the interface between the inner casing 30 and the outer casing 20 and eventually enters the transparent liquid crystal display panel 10. As shown in FIG. 15, a thickness of the outer frame 120 is thinner than a thickness of the transparent display device; therefore, the outer frame 120 is inconspicuous.

Figure 17:
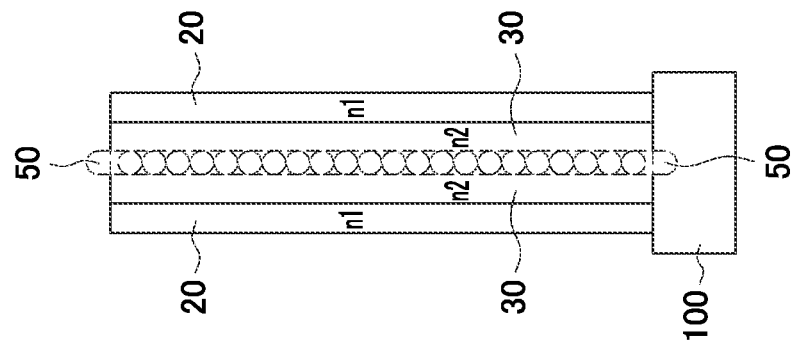
FIG. 17 is a side view of FIG. 16.
Figure 18:
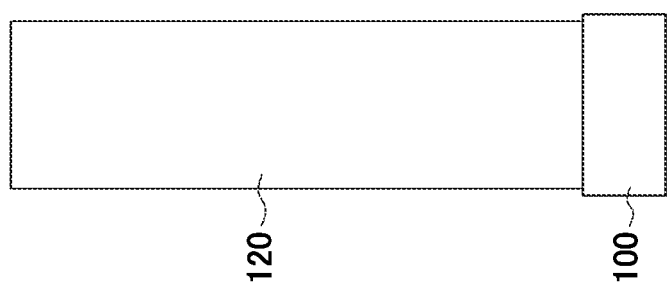
FIG. 18 is a side view of FIG. 16, in which the outer frame is eliminated.
Figure 16:
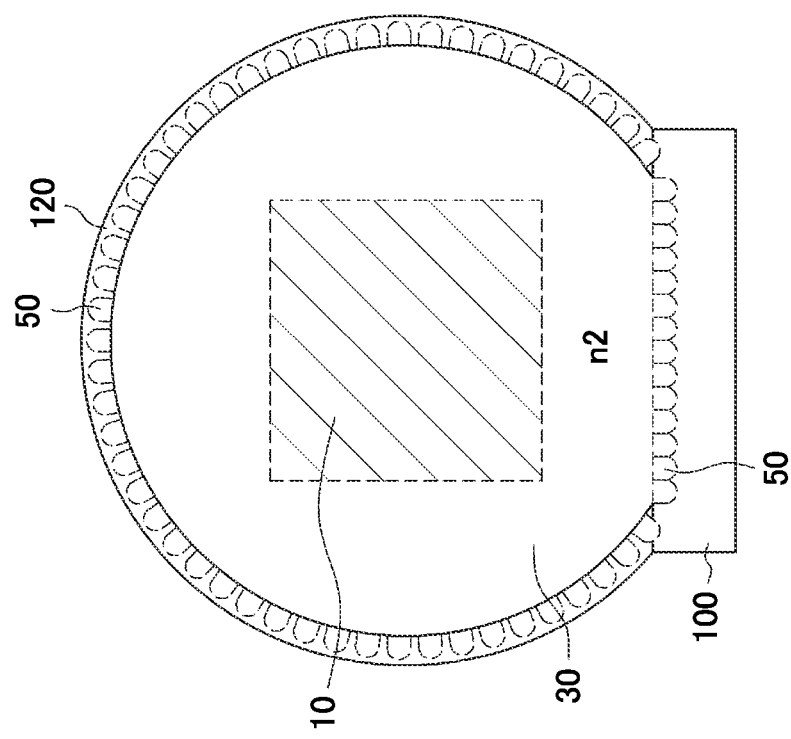
FIG. 16 is a front view of a seventh example of embodiment 1.

FIG. 16 is a front view of a seventh example of embodiment 1; FIG. 17 is a side view of FIG. 16. FIG. 18 is a side view of FIG. 16, in which the outer frame 120 is eliminated. In FIG. 16, outer shape of the display device is round. In FIG. 16, the LEDs 50 are disposed all around in the round outer frame 120. LEDs 50 are disposed also in the pedestal 100; therefore, the light enters the transparent liquid crystal display device 10 from all around.

In FIG. 16, the inner casing 30, which acts as a light guide to guide the light from the LEDs 50 into the transparent liquid crystal display panel 10, is formed to surround the transparent liquid crystal display panel 10. In the meantime, a thickness of the outer frame 120 is made thicker to cover the side surfaces of the outer casing 20 and the inner casing 30. However, this is only an example; a thickness of the outer frame 120 can be made thinner than a thickness of the display region of the display device as depicted in FIG. 15.

FIG. 18 is a side view of FIG. 17, in which the outer frame 120 is eliminated. In FIG. 18, the inner casing 30 is made thicker compared with that of FIG. 15 and so forth. The inner casing 30 is sandwiched by the outer casings 20. The light from the LEDs 50 repeats the reflection at the interface between the inner casing 30 and the outer casing 20 and eventually enters the side surface of the transparent liquid crystal display panel 10. In this case too, the light enters the transparent liquid crystal display panel 10 from all around; thus, a bright screen can be attained.

Embodiment 2

Figure 19:
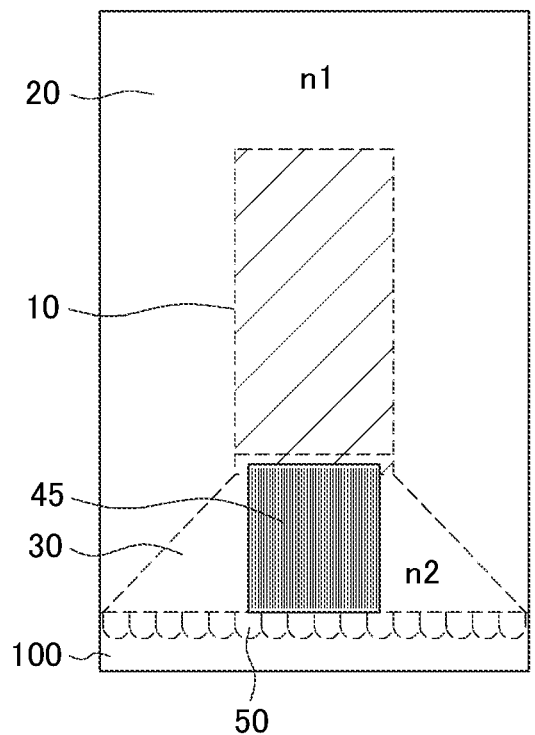
FIG. 19 is a front view of a transparent display device as a comparative example to embodiment 2.

Electric signals are necessary to drive the transparent liquid crystal display device 10. Generally, the electric signals are supplied via the flexible wiring substrate (may be referred to as film like wiring substrate). The flexible wiring substrate is formed as that wirings of the cupper is formed on the colored resin substrate (generally polyimide substrate) of a thickness of e.g. 30 micron. In FIG. 19, such a flexible wiring substrate 45 is adopted to the structure of FIG. 10, which is a fourth example of embodiment 1.

Figure 20:
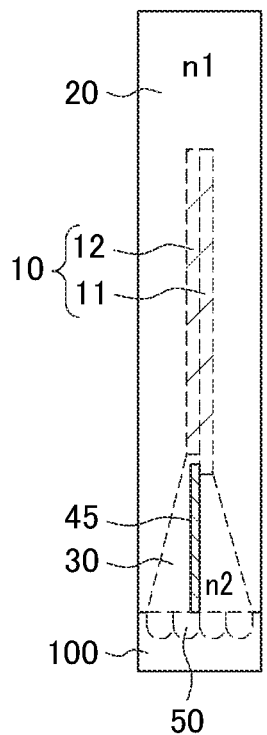
FIG. 20 is a side view of FIG. 19.

In FIG. 10, the inner casing 30, which is a light guide to guide the light from the LEDs 50 into the transparent liquid crystal display panel 10, is a transparent material of a refractive index n2; however, as shown FIG. 19, if the flexible wiring substrate 45 is opaque, an impression as the transparent display device is deteriorated. FIG. 20 is a side view of FIG. 19. The signals are supplied from the driver IC, which is installed in the pedestal 100, to the first substrate 11 of the transparent liquid crystal display panel 10 via the colored flexible wiring substrate 45.

FIG. 21 is a front view of the first example of embodiment 2 according to the present invention; FIG. 22 is a side view. In FIG. 21, the transparent flexible wiring substrate 40 is used to supply signals to the transparent liquid crystal display device 10. The transparent flexible wiring substrate 40 is formed as that the wirings 41 of fine pattern, which is hard to see, is formed on the transparent resin film. The wirings 11 of fine pattern can be made of metal films or transparent conductive films made of metal oxide conductive films as e.g. ITO (Indium Tin Oxide) and so forth. Polyethylene terephthalate, acrylic and so forth can be used as a transparent resin for the base film; polyimide can also be used as the transparent resin according to the curing condition.

Since the transparent flexible wiring substrate 40 is disposed in the inner casing 30, if the refractive index of the transparent flexible wiring substrate 40 is near to the refractive index of the inner casing 30, the reflection at the interface between the inner casing 30 and the flexible wiring substrate 40 is suppressed. If the refractive index of the base film of the transparent flexible wiring substrate 40 is n3, it is preferable to have a relation between the refractive index n2 of the inner casing 30 and the refractive index n1 of the outer casing 20 as: n3, n2>n1.

Another feature of FIG. 21 is that the area of the transparent wiring substrate 40 is made larger by making a width of the transparent flexible wiring substrate 40 wider in going toward the side of the pedestal 100, thus, a distance between the wrings 41 can be made larger. The wirings 41 become further invisible by making the distance between the wirings 41 larger. In addition, a width of each of the wirings 41 can be made larger according to the distance between the wirings is made larger, thus, resistance of the wirings 41 can be decreased.

In one example, a pitch of the pixels in the transparent liquid crystal display panel 10 is 200 microns, which is not visible for the viewers. If a distance between the wirings 41 is at least the same as the pixel pitch in the transparent liquid crystal display panel 10, the wiring 41 are not visible for the viewers even the wirings 41 are made of metal; thus, a design as a transparent liquid crystal display device is not deteriorated.

FIG. 22 is a side view of FIG. 21; four LEDs 50 are disposed in the thickness direction of the pedestal 100. The transparent flexible wiring substrate 40 is disposed in the inner casing 30 to supply video signals and so forth to the transparent liquid crystal display panel 10.

By the way, there is a case that the reflection from the transparent flexible wiring substrate 40 cannot be sufficiently suppressed due to a relation of refractive indices between the transparent flexible wiring substrate 40 and the inner casing 30 according to the refractive index of the base film of the transparent flexible wiring substrate 40. In another case, the reflection from the wirings 41 is not sufficiently suppressed due to a relation between the refractive index of the wirings 41 and the refractive index of the inner casing 30.

In such a case, an existence of the transparent flexible wiring substrate 40 can be made less visible by coating or adhering, on the surface of the transparent flexible wiring substrate 40, the material having refractive index of n4, which is different from both the refractive index n2 of the inner casing 30 and the refractive index n3 of the transparent flexible wiring substrate 40. If the reflection from the wiring 41 of the transparent flexible wiring substrate 40 is conspicuous, the existence of the transparent flexible wiring substrate 40 can be made less visible by coating or adhering, on the surface of the metal oxide conductive film 41, the material having refractive index of n6, which is different from both the refractive index n2 of the inner casing 30 and the refractive index n5 of the metal oxide conductive film 41 of the transparent flexible wiring substrate 40

The structure of FIGS. 23 and 24 is a second example of embodiment 2, which realizes the above explained structure. FIG. 23 is a front view and FIG. 24 is a side view of FIG. 23. The outer shape of FIG. 23 is the same as the outer shape of FIG. 21; however, the transparent material 42, which has a different refractive index from the refractive index of the transparent flexible wiring substrate 40, is formed on the surface of the transparent flexible wiring substrate 40. FIG. 24 is a side view of FIG. 23. In FIG. 24, the transparent flexible wiring substrate 40 extends from the pedestal 100, in which the driver ICs and so forth are disposed, to the transparent liquid crystal display panel 10. The transparent material 42, which has a refractive index of e.g. n4, is coated or adhered to the surface of the transparent flexible wiring substrate 40. If a suppression of the reflection from the metal oxide conductive film 41 having refractive index of n5 is intended, the refractive index of the transparent material 42 is n6.

If a suppression of the reflection from the flexible wiring substrate 40 is intended, the refractive index n4 of the transparent material 42 is preferably between the refractive index n2 of the inner casing 30 and the refractive index n3 of the base film of the transparent flexible wiring substrate 40. If a suppression of the reflection from the transparent conductive film 41 of the flexible wiring substrate 40 is intended, the refractive index n6 of the transparent material 42 is preferably between the refractive index n2 of the inner casing 30 and the refractive index n5 of the transparent conductive film 41 of the flexible wiring substrate 40.

Figure 25:
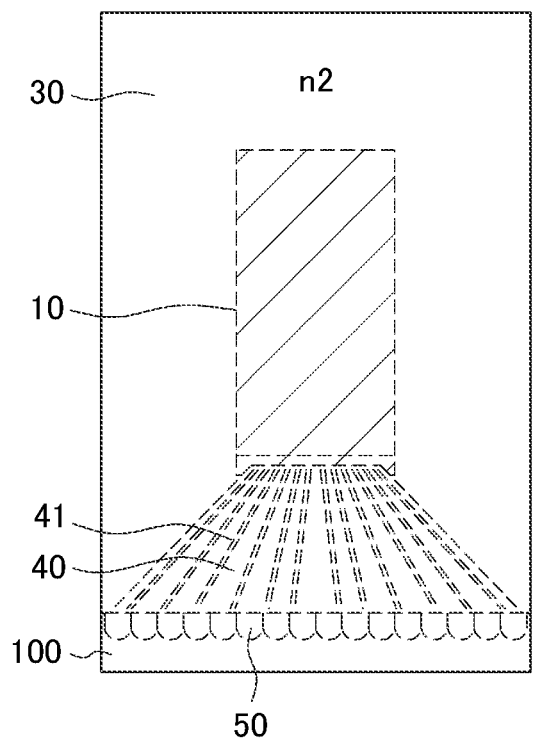
FIG. 25 is a front view of a third example of embodiment 2.
Figure 26:
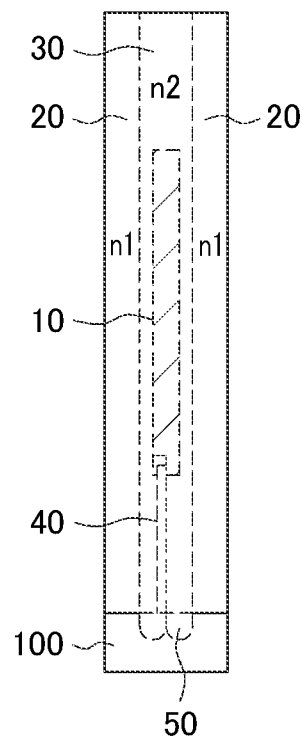
FIG. 26 is a side view of FIG. 25.

FIG. 25 is a front view of a third example of embodiment 2; FIG. 26 is a side view of FIG. 25. The outer shape of FIG. 25 resembles to the outer shape of FIG. 23, however, FIG. 25 is different from FIG. 23 in that the transparent liquid crystal display panel 10 is housed in the inner casing 30, not in the outer casing 20. FIG. 26 depicts the transparent liquid crystal display panel 10 being housed in the inner casing 30; the outer casings 20 sandwiching the inner casing 20. In FIG. 26, the light from the LEDs 50 reflects at the interface between the inner casing 30 and the outer casing 20, and eventually enters the transparent liquid crystal display panel 10.

As shown in FIG. 25, the wirings 41 on the transparent flexible wiring substrate 40 are diagonal wirings, in which lengths of wirings are different according to positions. Therefore, a difference of the resistance according to the length of the wiring 41 becomes large in the transparent flexible wiring substrate 40.

FIG. 27 is a front view of a fourth example of embodiment 2, which counter measures the above explained problem. The transparent flexible wiring substrate 40 is connected with the longer side of the transparent liquid crystal display panel 10. As a result, a width of the transparent flexible wiring substrate 40 can be made wider; thus, diagonal wirings are not necessary to supply signals to the transparent liquid crystal display panel 10. Therefore, the resistances of the wirings in the transparent wiring substrate 40 can be easily made uniform. In FIG. 27, driver ICs are installed in the pole 110 or the pedestal 100. Metal wirings can be used in the pole 110.

FIG. 28 is a side view of FIG. 27. Since the flexible wiring substrate does not exist between the pedestal 100 and the transparent liquid crystal display panel 10, the transparent liquid crystal display panel 10 looks like floating in the inner casing 30. The inner casing 30 is sandwiched by the outer casings 20.

Figure 29:
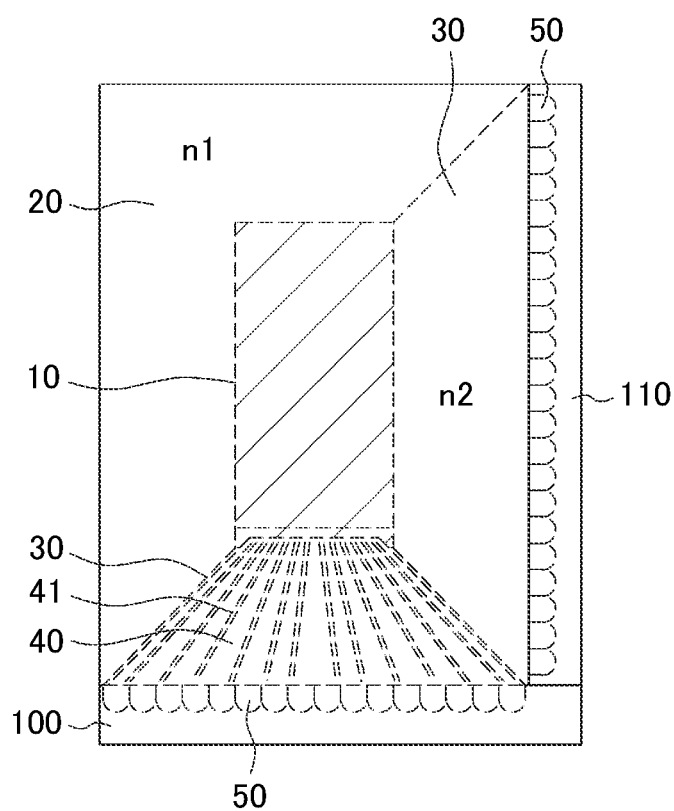
FIG. 29 is a front view of a fifth example of embodiment 2.
Figure 30:
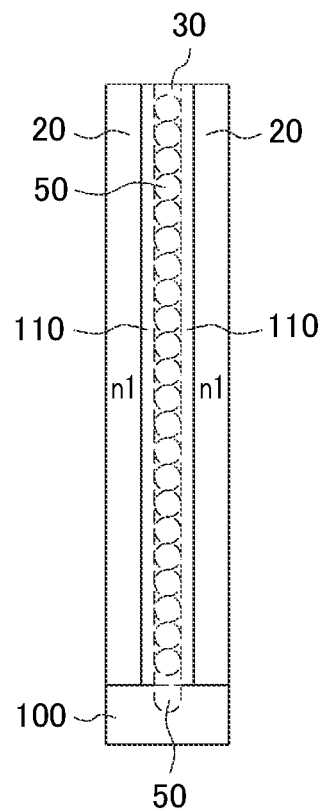
FIG. 30 is a side view of FIG. 29.

FIGS. 29 and 30 show a fifth example of embodiment 2; FIG. 29 is a front view and FIG. 30 is a side view. In FIG. 29, LEDs 50 are disposed not only in the pedestal by also in the pole 110 to supply light to the transparent liquid crystal display panel 10 not only from the short side but also from the long side. Accordingly, bright images can be formed in the structure of the fifth example.

In FIG. 29, the inner casing 30 as a light guide is disposed between the LEDs 50 and the transparent liquid crystal display panel 10. As shown in FIG. 30, the inner casing 30 is sandwiched by the outer casings 20.

Figure 31:
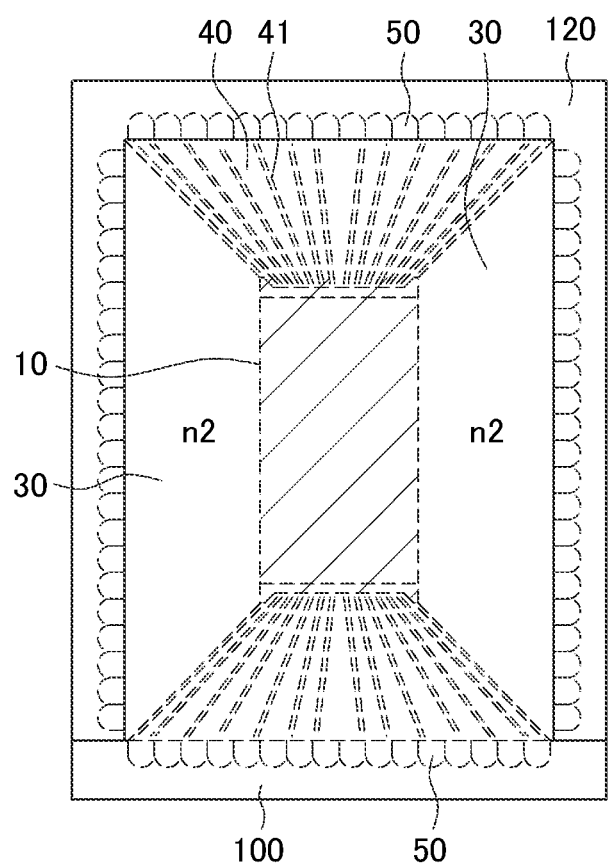
FIG. 31 is a front view of a sixth example of embodiment 2.
Figure 32:
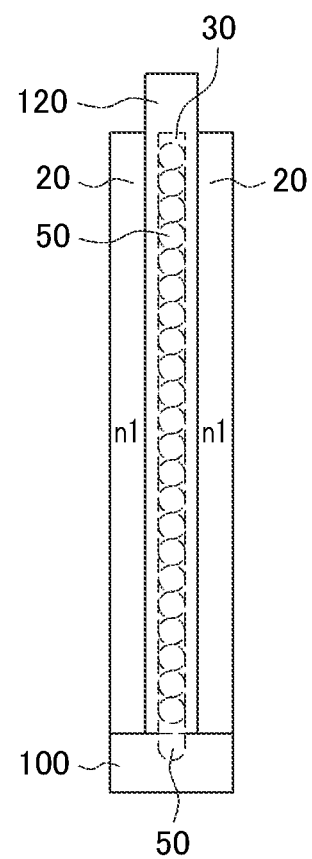
FIG. 32 is a side view of FIG. 31.

FIGS. 31 and 32 show a sixth example of embodiment 2; FIG. 31 is a front view and FIG. 32 is a side view. The relations between the LEDs 50, the inner casing 30, and the outer casing 40 in FIGS. 31 and 32 are the same as explained in FIGS. 14 and 15. The feature of FIG. 31 is that the transparent flexible wiring substrates 40 are connected to two sides of the transparent liquid crystal display panel 10. As a result, a density of wirings in the transparent flexible wiring substrate 40 can be decreased, consequently, the existence of the wirings 41 can be made further inconspicuous. In addition, a resistance of the wiring 41 can be made smaller since a width of the wiring 41 can be made larger.

Figure 33:
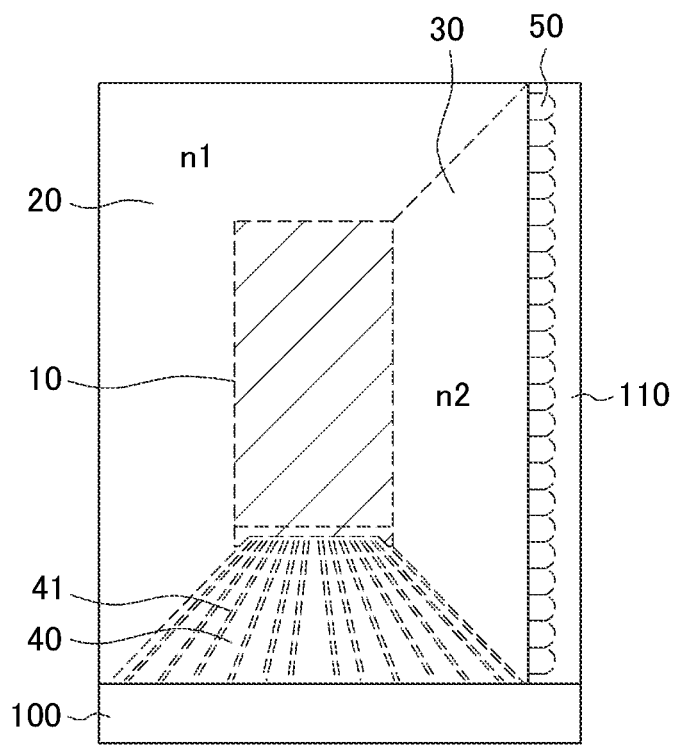
FIG. 33 is a front view of a seventh example of embodiment 2.
Figure 34:
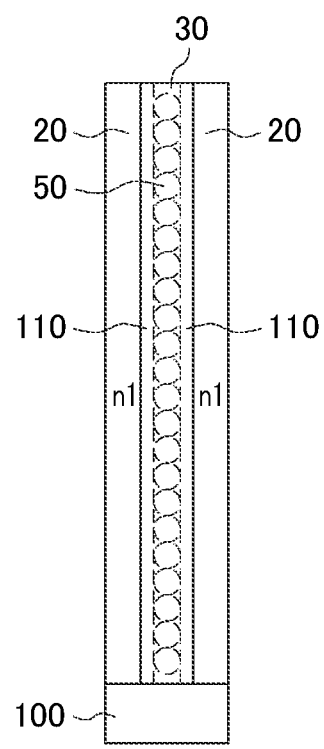
FIG. 34 is a side view of FIG. 33.

FIGS. 33 and 34 show a seventh example of embodiment 2; FIG. 33 is a front view and FIG. 34 is a side view. The feature of FIG. 33 is that the pole 110 is formed at the side corresponding to the long side of the transparent liquid crystal display panel 10, and LEDs 50 are disposed in the pole 110. On the other hand, LEDs 50 are not disposed in the pedestal 100. The transparent flexible wiring substrate 40 exists between the pedestal 100 and the transparent liquid crystal display panel 10.

If the transparent flexible wiring substrate 40 exists in the inner casing 30, which works as a light guide, the light from the LEDs 50 is scattered by the transparent flexible wiring substrate 40; thus, flickers tend to be generated. In the structure of FIG. 33, the inner casing 30 as a light guide and the transparent flexible wiring substrate 40 are disposed separately; therefore, such flickers can be avoided.

The inner casing 30 as a light guide is disposed between the pole 110 in which LEDs 50 are disposed and the transparent liquid crystal display panel 10. As shown in FIG. 34, the inner casing 30 is sandwiched by the outer casings 20. The light from the LEDs 50 repeats reflections at the interface between the inner casing 30 and the outer casing 20, and eventually enters the transparent liquid crystal display panel 10.

Figure 35:
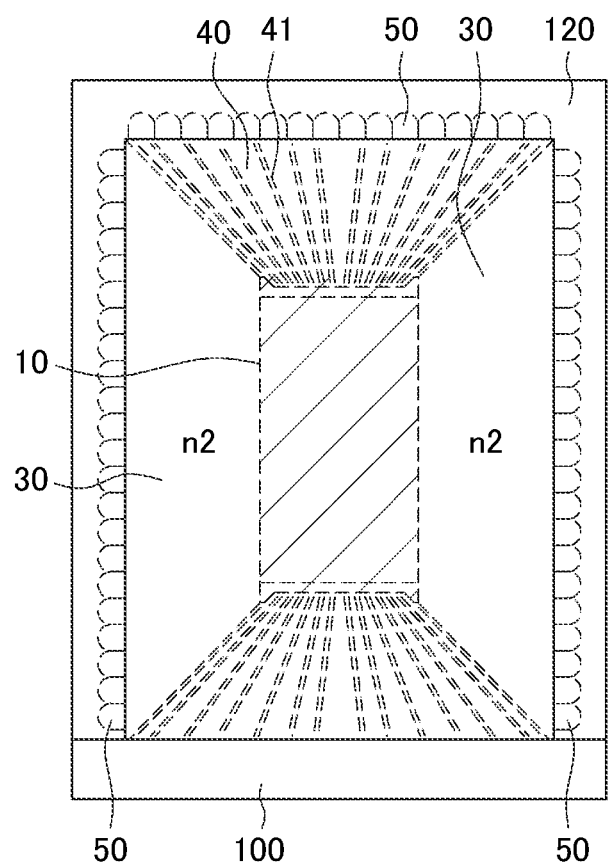
FIG. 35 is a front view of an eighth example of embodiment 2.
Figure 36:
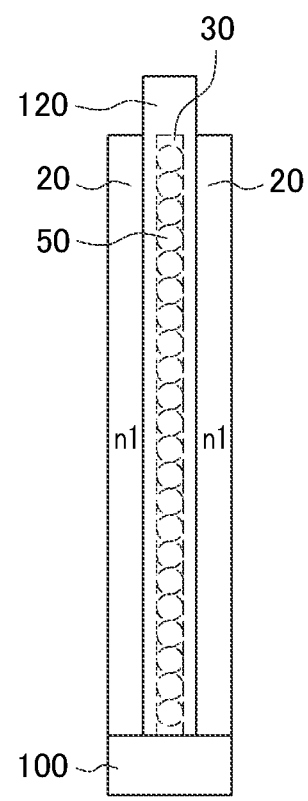
FIG. 36 is a side view of FIG. 35.

FIGS. 35 and 36 show an eighth example of embodiment 2; FIG. 35 is a front view and FIG. 36 is a side view. In FIG. 35, the liquid crystal display device is surrounded by the outer frame 120. The structure of the outer frame 120 is the same as explained in FIGS. 14 and 15. The feature of FIG. 35 is that the LEDs 50 are disposed in the opposing two sides of the outer frame 120; The LEDs 50 are not disposed in the pedestal 100 and in the side of the outer frame 120 opposing to the pedestal 100; the transparent flexible wiring substrates 40 are disposed between the transparent liquid crystal display panel 10 and the pedestal 100, and between the transparent liquid crystal display panel 10 and the side of the outer frame 120 opposing to the pedestal 100.

In FIG. 36, the inner case 30, which guides the light from the LEDs 50 to the transparent liquid crystal display panel 10, and the transparent flexible wiring substrate 40 are separated; thus, the flickers caused by scattering of light at the transparent flexible wiring substrate 40 can be suppressed, which is the same mechanism as explained in FIG. 33. The structure of FIG. 35, however, has further merits as: brightness of the images is increased because the LEDs 50 are disposed in the two sides; and the density in wirings 41 in the transparent flexible wiring substrate 40 can be decreased because two transparent flexible wiring substrates 40 are used, thus, existence of the transparent flexible wiring substrate 40 can be made further inconspicuous.

FIG. 36 is a side view of FIG. 35; the structure of FIG. 35 is the same as FIG. 34 and so forth in that the inner casing 30 and the transparent liquid crystal display panel 10 are sandwiched by the outer casings 20. A thickness of the outer frame 120 is made thinner than a thickness of the transparent display device so that the outer frame 120 is made less conspicuous.

Figure 39:
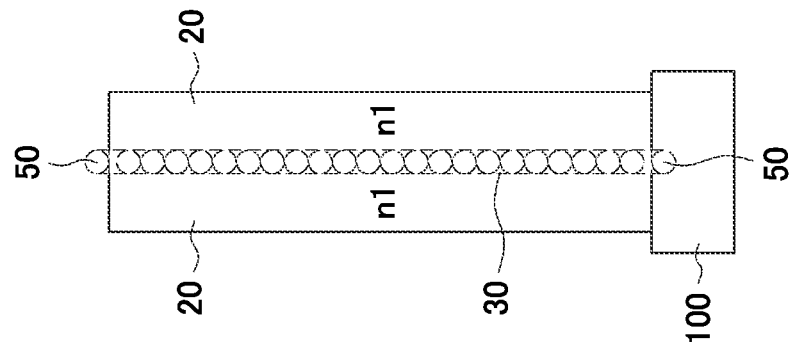
FIG. 39 is a side view of FIG. 37, in which the outer frame is eliminated.
Figure 38:
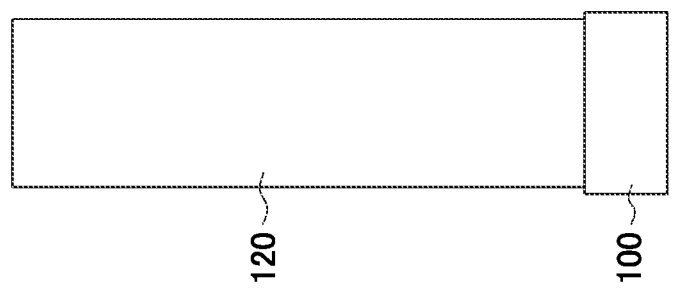
FIG. 38 is a side view of FIG. 37.
Figure 37:
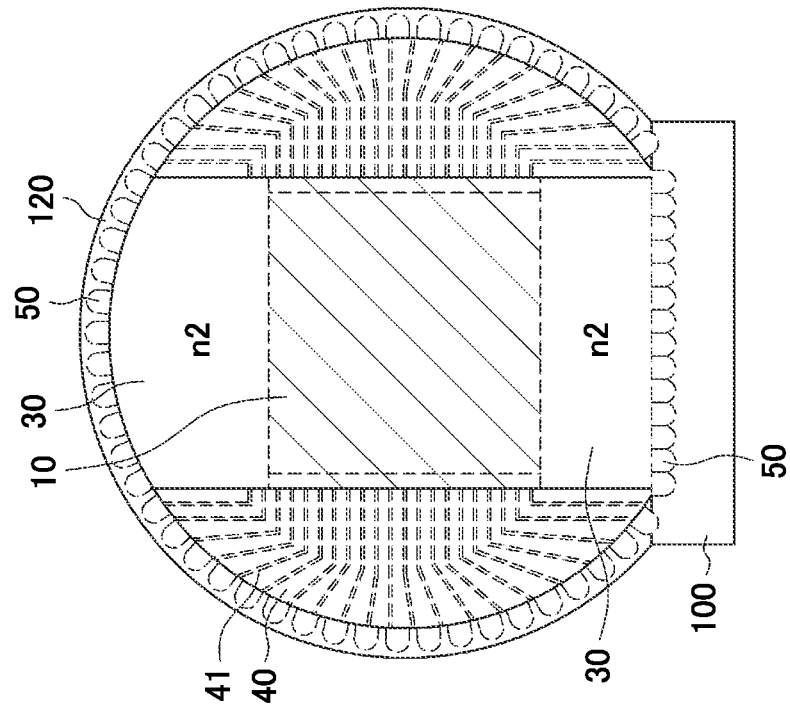
FIG. 37 is a front view of a ninth example of embodiment 2.

FIGS. 37, 38 and 39 show a ninth example of embodiment 2; FIG. 37 is a front view, FIG. 38 is a side view, and FIG.

39 is a side view when the outer frame 120 is eliminated. In FIG. 37, the transparent liquid crystal display device is disposed in the round outer frame 120. The LEDs 50 are disposed in the round outer frame 120 and in the pedestal 100; the light from the LEDs 50 enters the transparent liquid crystal display device 10 from all around. The inner casing 30 as a light guide is disposed between the transparent liquid crystal display panel 10 and the peripheral LEDs 50.

In FIG. 37, the transparent flexible wiring substrates 40 are connected to two opposing sides of the transparent liquid crystal display panel 10. Each of the transparent flexible wiring substrates 40 is connected with the circuit board disposed in the round outer frame 120. In FIG. 37, since the areas of two flexible wiring substrates can be made large, a density of the wirings 41 can be made small; thus, wirings 41 of the transparent flexible wiring substrate 40 can be made further inconspicuous.

As shown in FIG. 38, a thickness of the outer frame 120 is the same as a thickness of the transparent display device or made thicker than that. Plating gold, silver, copper or so forth on the outer frame 120 can attain high design quality. FIG. 39 is a side view of the transparent display device when the outer frame 120 is eliminated. As shown in FIG. 39, the inner casing 30 as the light guide is sandwiched by the outer casings 20. The light from the LEDs 50 reflects at the interface between the inner casing 30 and the outer casing 20, and eventually enters the transparent liquid crystal display panel 10.

Figure 40:
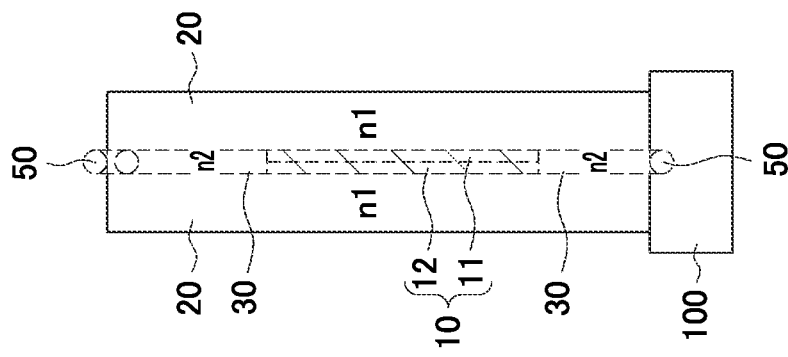
FIG. 40 is a front view of a tenth example of embodiment 2.
Figure 41:
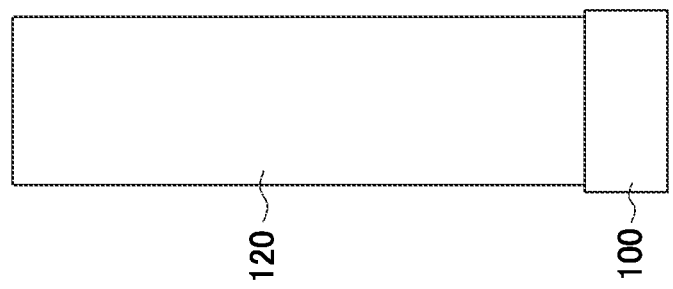
FIG. 41 is a side view of FIG. 40.
Figure 42:
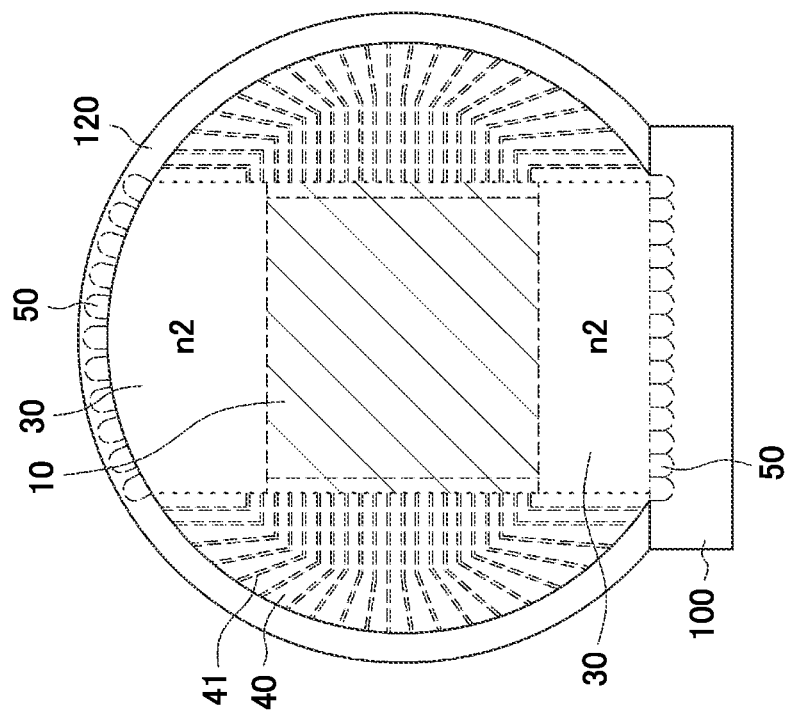
FIG. 42 is a side view of FIG. 40, in which the outer frame is eliminated.

FIGS. 40, 41 and 42 show a tenth example of embodiment 2; FIG. 40 is a front view, FIG. 41 is a side view and FIG. 42 is a side view when the outer frame 120 is eliminated. In FIG. 40, the transparent liquid crystal display device is disposed in the round outer frame 120. FIG. 40 differs from FIG. 37 in that the LEDs 50 are disposed in the pedestal 100 and in a region of the outer frame 120 opposing to the pedestal 100; thus, the light from the LEDs 50 enters the transparent liquid crystal display device 10 from two sides.

The transparent flexible wiring substrates 40 are connected to other two sides of the transparent liquid crystal display panel 10; each of the two flexible wiring substrates 40 has a large area. Therefore, a wiring density can be made low, thus, the wirings 41 of the transparent flexible wiring substrate 40 can be made further inconspicuous. In addition, the light from the LEDs 50 does not interfere with the transparent flexible wiring substrate 40, thus, flickers due to existence of the flexible wiring substrate 40 can be avoided.

FIG. 41 is a side view of FIG. 40; the structure is the same as explained in FIG. 38. In FIG. 42, the transparent liquid crystal display panel 10 and the inner casing 30 as the light guide are sandwiched by the outer casings 20. The light from the LEDs 50 reflects at the interface between the inner casing 30 and the outer casing 20, and eventually enters the transparent liquid crystal display panel 10.

Figure 43:
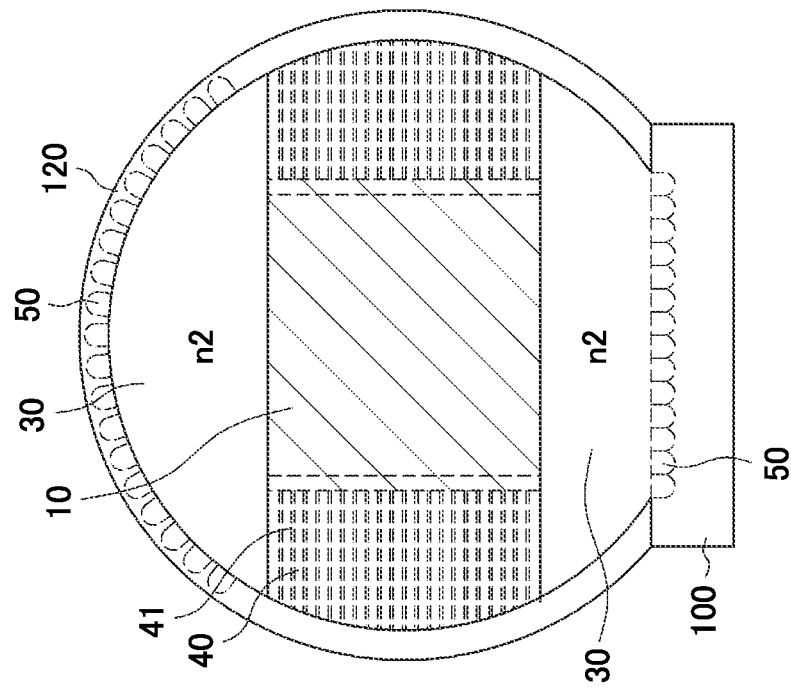
FIG. 43 is a front view of an eleventh example of embodiment 2.
Figure 44:
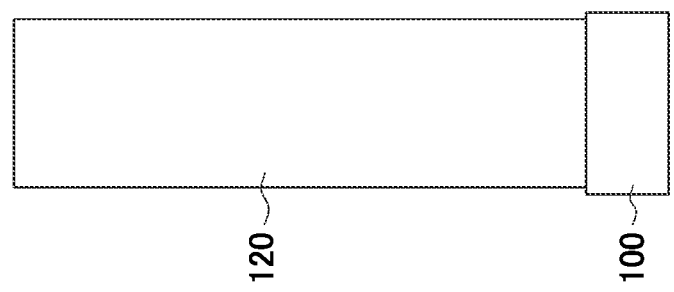
FIG. 44 is a side view of FIG. 43.
Figure 45:
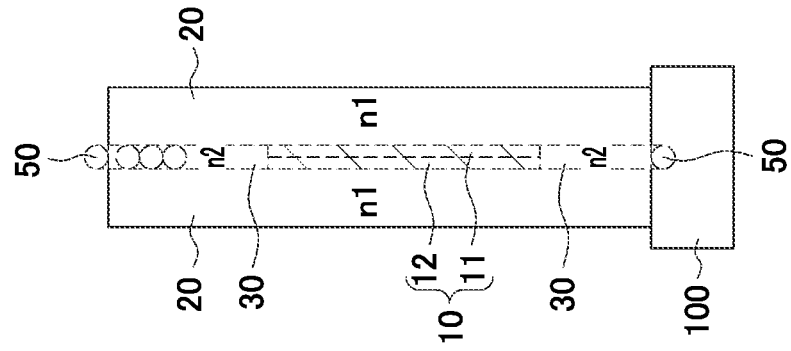
FIG. 45 is a side view of FIG. 43, in which the outer frame is eliminated.

FIGS. 43, 44 and 45 show an eleventh example of embodiment 2; FIG. 43 is a front view, FIG. 44 is a side view and FIG. 45 is a side view when the outer frame 120 is eliminated. In FIG. 43, the transparent liquid crystal display device is disposed in the round outer frame 120. FIG. 43 differs from FIG. 40 in that the wirings 41 are straight in the transparent flexible wiring substrate 40, which is connected to the transparent liquid crystal display panel 10. If the wirings 41 are complex shape, it is difficult to make the resistance of the wirings 41 uniform; however, if the wirings 41 are straight, it is easy to adjust the resistance of the wirings 41.

In FIG. 43, the number of the LEDs 50 is increased in the pedestal 100 and in the region of the outer frame 120, which opposes to the pedestal 100. Therefore, brighter mages can be produced in FIG. 43 compared with the case of FIG. 40. FIG. 44 is a side view, which is the same explained in FIG. 41. FIG. 45 is a side view in which the outer frame 120 is eliminated; the structure of FIG. 45 is the same as the structure of FIG. 42 except that the number of the LEDs 50 is increased in FIG. 45.

Embodiment 3

Figure 46:
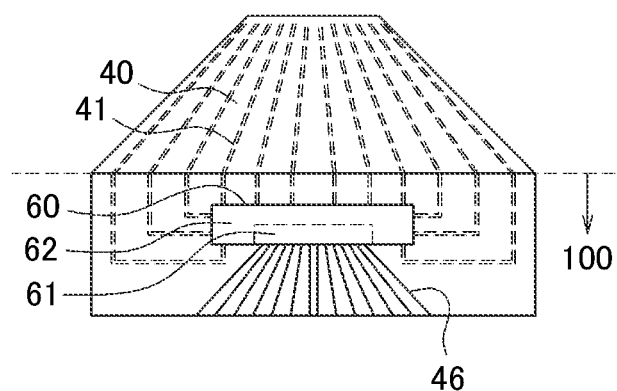
FIG. 46 is a plan view of a first example of embodiment 3.

FIG. 46 is a plan view of an example of the transparent flexible wiring substrate 40, which is used in the present invention. In the transparent flexible wiring substrate 40 of FIG. 46, the upper portion than the broken line is a potion that extends to the transparent display panel 10; the lower portion than the broken line is a portion to be in the pedestal 100. The driver IC 60, which drives the transparent liquid crystal display device 10, is installed on the transparent flexible wiring substrate 40. The driver IC 60 has an input region 61, which takes powers and signals from the external circuit, and an output region 62, which supply scan signals and video signals to the transparent liquid crystal display panel 10 from the driver IC 60.

In the transparent flexible wiring substrate 40 according to the present invention, the wirings 41 are connected to the output region 62; however, the resistivity of the wirings 41 is high, thus, a width of the wirings 41 is made large to decrease the resistance. Therefore, lager area is necessary for the output region 62. In the structure of the driver IC 60 of FIG. 46, the first long side, the two short sides and parts of the second long side are allocated to the output region 62 to secure the area.

In the meantime, the input region 61 of driver IC 60 is contained in the pedestal 100, thus, metal wirings 46, which are different form wirings 41, can be used; therefore, a pitch of the wirings can be made smaller or a width of the wirings can be made narrower. Therefore, the connection area of the input region 61 can be made smaller.

Figure 47:
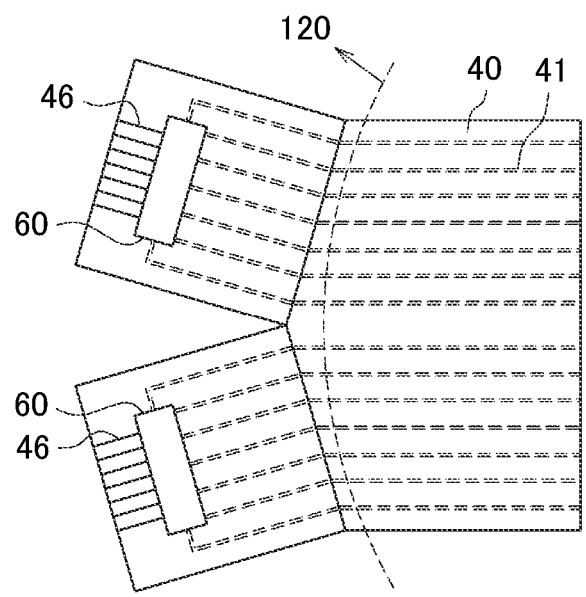
FIG. 47 is a plan view of a second example of embodiment 3.

FIG. 47 is a plan view of another example of the transparent flexible wiring substrate 40, which is used in the present invention. In the transparent flexible wiring substrate 40 of FIG. 47, the inner portion than the broken line is a potion that extends to the transparent display panel 10; the outer portion than the broken line is a portion to be in the round outer frame 120. More area is allocated to the output region 62 in the driver IC 60, which is the same as explained in FIG. 46.

In FIG. 47, the wirings 41 of the transparent flexible wiring substrate 40 are allocated to two driver ICs 60, which are contained in the outer frame 120. Thus, a complex drawing in the wirings 41 can be avoided. In the meantime, the wirings 46 are made of metal, thus, resistance of the wirings 46 does not raise a big problem, even if the wirings 46 are drawn in a direction to the pedestal 100.

Embodiment 4

Figure 48:
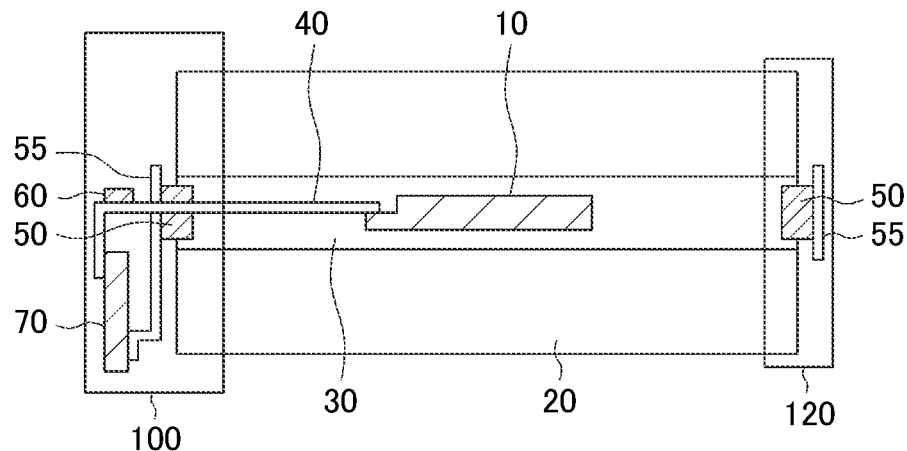
FIG. 48 is a plan view of a first example of embodiment 4.

FIG. 48 is a cross sectional view of a concrete structure of the transparent display device according to the present invention. In FIG. 48, the transparent liquid crystal display panel 10 is contained in the inner casing 30, which has a role of a light guide. The inner casing 30 is sandwiched by the outer casings 20. The refractive index n2 of the inner casing 30 is larger than the refractive index n1 of the outer casing 20. The LEDs 50 are disposed at the ends of the inner casing 30. The light from the LEDs 50 repeats the reflection at the interface between the inner casing 30 and the outer casing 20, and eventually enters the transparent liquid crystal display panel. The LEDs 50 at one side are installed on the flexible wiring substrate 55 for the LEDs 50 in the outer frame 120, and the LEDs 50 at another side are installed on the flexible wiring substrate 55 for the LEDs 50 in the pedestal 100.

The transparent flexible wiring substrate 40 on which the wirings 41 are formed is connected to the liquid crystal display panel 10 to supply scan signals or video signals to the transparent liquid crystal display panel 10. The driver IC 60 is installed on the transparent flexible wiring substrate 40 in the pedestal 100. The transparent flexible wiring substrate 40 is connected to the wiring substrate 70 disposed in the pedestal 100. The flexible wiring substrate 55 for the LEDs 50 is also connected to the wiring substrate 70.

Since steps exist at a surface of the transparent liquid crystal display panel 10 or the transparent flexible wiring substrate 40, a gap may be generated if the inner casing 30 is made of hard material. In the structure of FIG. 48, however, the inner casing 30 is made of transparent gel as silicone resin, or urethane resin and so forth, to avoid a gap in the inner casing 30.

The inner casing 30 is sandwiched by the outer casings 20 so as not to contain bubbles; after that, they are mounted in the pedestal 100 or in the outer frame 120. The transparent gel as urethane resin or silicone resin and so forth are used for the inner casing 30, and glass or resin such as acrylic resin or polycarbonate and so forth are used for the outer casing 20.

Figure 49:
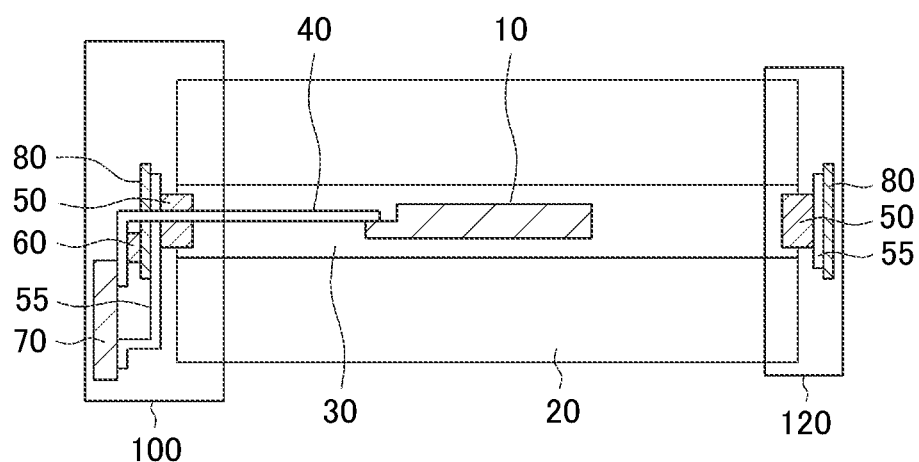
FIG. 49 is a plan view of a second example of embodiment 4.

The LEDs 50 in FIG. 48 generate heat and become high temperature. In the structure in which many LEDs 50 are disposed in the pedestal 100 or in the outer frame 120, the transparent display device itself becomes high temperature. FIG. 49 is a second example of embodiment 4 to counter measure the above described problem. In FIG. 49, heat pipe 80 is disposed at the back of the flexible wiring substrate 55 for the LEDs 50. The structure of the heat pipe 80 is that the fluid, like water, is contained in the container made of e.g. copper alloy, which has high heat conductivity; the heat pipe transfers the heat from a high temperature portion to a low temperature portion quickly. The heat pipe 80 can be made as thin as 3 mm. A heat dissipation portion must be provided to use the heat pipe 80. Metal fins provided at the pedestal 100 can be a heat dissipation portion. In the meantime, the driver IC 60 also becomes high temperature, thus, it is preferable that effect of the heat pipe 80 also influences to the driver IC 60.

FIGS. 50 to 52 are an example in which the transparent display device is surrounded by the heat pipe 80. In FIG. 50, the LEDs 50 are disposed in the longer sides of the transparent display device. The heat pipe 80 is disposed outside of the flexible wiring substrate 55 for the LEDs 50 and the surrounds the display device. The flexible wiring substrate 55 for the LEDs 50 also surrounds the display device; however, the flexible wiring substrate 55 for the LEDs 50 can be set only at the side in which the LEDs 50 are disposed. The pedestal 100 is not shown in FIG. 50; however, the lower temperature portion of the heat pipe 80 can be disposed at the pedestal 100.

FIG. 51 is a side view of FIG. 50. In FIG. 51, outside of the transparent display device is surrounded by the heat pipe 80. Since the heat pipe 80 is disposed only at the place in which temperature becomes high, a thickness of the heat pipe 80 is thinner than a thickness of the transparent display device. FIG. 52 is a side view of the transparent display device in which the heat pipe 80 is eliminated. The structure of FIG. 52 is the same as explained in embodiment 1 and embodiment 2 as the present invention.

Figure 53:
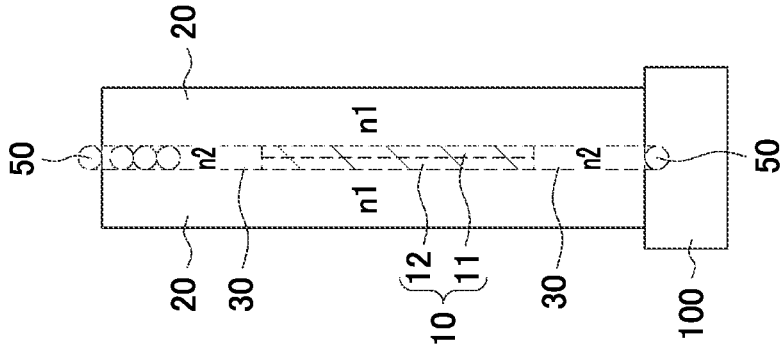
FIG. 53 is a plan view of a fourth example of embodiment 4.
Figure 54:
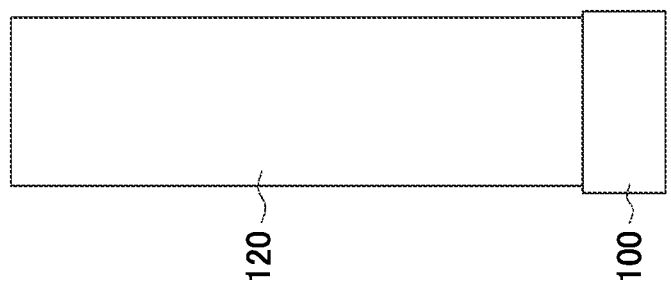
FIG. 54 is a side view of FIG. 53.
Figure 55:
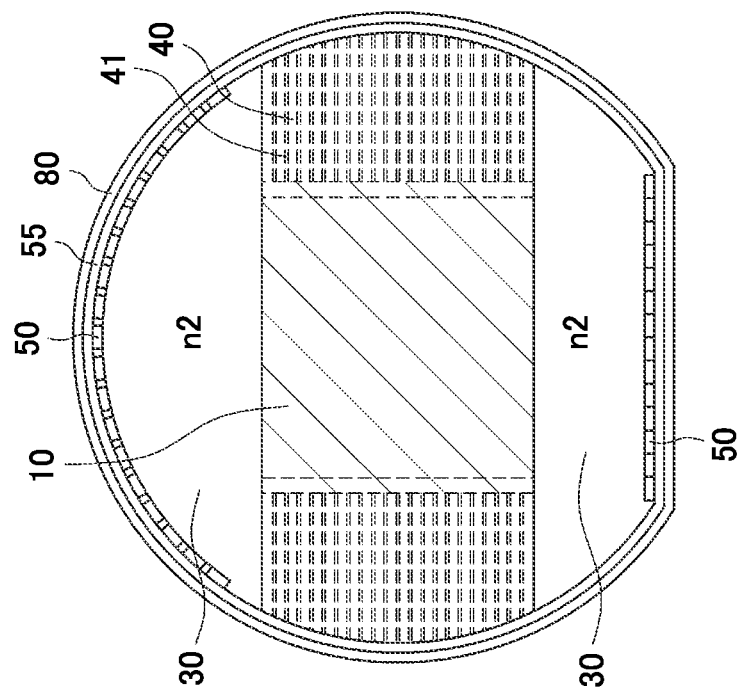
FIG. 55 is a side view of FIG. 53, in which the outer frame is eliminated.

FIGS. 53 to 55 are another example in which the heat pipe 80 surrounds the transparent display device. The outer shape of the display device of FIG. 52 is round. In FIG. 53, the LEDs 50 are disposed in the pedestal 100 and in the portion of the outer frame 120 opposing to the pedestal 100. The heat pipe 80 is disposed outside of the flexible wiring substrate 55 for the LEDs 50, and surrounds the display device. The flexible wiring substrate 55 for the LEDs 50 also surrounds the display device; however, the flexible wiring substrate 55 for the LEDs 50 can be set only at the side in which the LEDs 50 are disposed. The pedestal 100 is not shown in FIG. 53; however, lower temperature portion of the heat pipe 80 can be disposed at the pedestal 100.

FIG. 54 is a side view of the transparent display device in which the outer frame 120 is added to the structure of FIG. 53. The heat pipe 80 is disposed inside of the outer frame 120. In the meantime, the outer frame 120 can work as a heat dissipation means to assist the heat pipe 80 by using metals as e.g. copper for the outer frame 120. FIG. 55 is a side view of the transparent display device in which the outer frame 120 and the heat pipe 80 are eliminated. This structure is the same as explained in embodiment 1 and embodiment 2 as the present invention.

The organic EL display device and the micro LED display device do not need a back light; however, the flexible wiring substrate, which sends the signals from the pedestal 100 to the display panel, must be inconspicuous to make the images of the display device look like floating in the air. Therefore, the structures explained in embodiment 2 are useful for the organic EL display device and the micro LED display device.

The present invention gives liberty in design, namely, the layout is not limited by distances between the transparent display device, the LEDs, external wirings, and the pedestal. The display device can be used as an ornament as a trophy, digital photo frame and so forth, which utilizes transparency in the design. Further, the transparent display device can be incorporated as a part of glass used in a transparent door or a window.

The present invention is explained as that the display panel 10 is housed in the outer casing 20, connected by the transparent flexible wiring 40, and set apart from the pedestal 100. The display device in the present invention is not necessarily limited to the transparent display panel; the present invention is also applicable to a structure of e.g. the display panel such as a liquid crystal display panel that needs a back light. Even the liquid crystal display panel needs a back light, as far as the flexible wiring substrate is transparent, the design quality as a display device can be maintained.

What is claimed is:
1. A display device comprising:
a plate shaped display medium, having a first major surface and a second major surface, disposed on a pedestal,
wherein
the display medium includes a liquid crystal display panel, disposed in a first transparent medium of refractive index n1,
first LEDs, which supply light to the liquid crystal display panel, are disposed in the pedestal,
a second transparent medium of refractive index n2 exists between the first LEDs and the liquid crystal display panel, and n2>n1,
a pole is set on the pedestal,
second LEDs are disposed in the pole, and
the second transparent medium exists between the second LED and the liquid crystal display panel.

2. A display device comprising:
a plate shaped display medium, having a first major surface and a second major surface, disposed on a pedestal,
wherein
the display medium includes a liquid crystal display panel, disposed in a first transparent medium of refractive index n1,
first LEDs, which supply light to the liquid crystal display panel, are disposed in the pedestal,
a second transparent medium of refractive index n2 exists between the first LEDs and the liquid crystal display panel, and n2>n1,
an outer frame is formed to surround the display medium,
second LEDs are disposed in the outer frame, and
the second transparent medium exists between the second LEDs and the liquid crystal display panel.

3. The display device according to claim 2,
wherein the liquid crystal display device is surrounded by the first LEDs and the second LEDs in a plan view.

4. The display device according to claim 2,
wherein the liquid crystal display device is surrounded by the second transparent medium in a plan view, and
the second transparent medium is sandwiched by the first transparent medium.

5. A display device comprising:
a plate shaped display medium, having a first major surface and a second major surface, disposed on a pedestal,
wherein
the display medium includes a liquid crystal display panel, disposed in a first transparent medium of refractive index n1,
first LEDs, which supply light to the liquid crystal display panel, are disposed in the pedestal,
a second transparent medium of refractive index n2 exists between the first LEDs and the liquid crystal display panel, and n2>n1,
a film like wiring substrate to supply signals to the liquid crystal display panel is disposed between the pedestal and the liquid crystal display device,
the film like wiring substrate is formed by a transparent base material of refractive index n3, n1>n3, and
wirings are formed on the transparent base material.

6. The display device according to claim 5,
wherein the film like wiring substrate exists in the second transparent medium.

7. The display device according to claim 5,
wherein a film of refractive index n4 is formed on a surface of the transparent wiring substrate, and
n4 is between n2 and n3.

8. The display device according to claim 5,
provided a refractive index of the wirings formed on the film like wiring substrate is n5,
a film of refractive index n6 is formed on the wirings, and
n6 is between n2 and n5.

* * * * *